Figure 1:
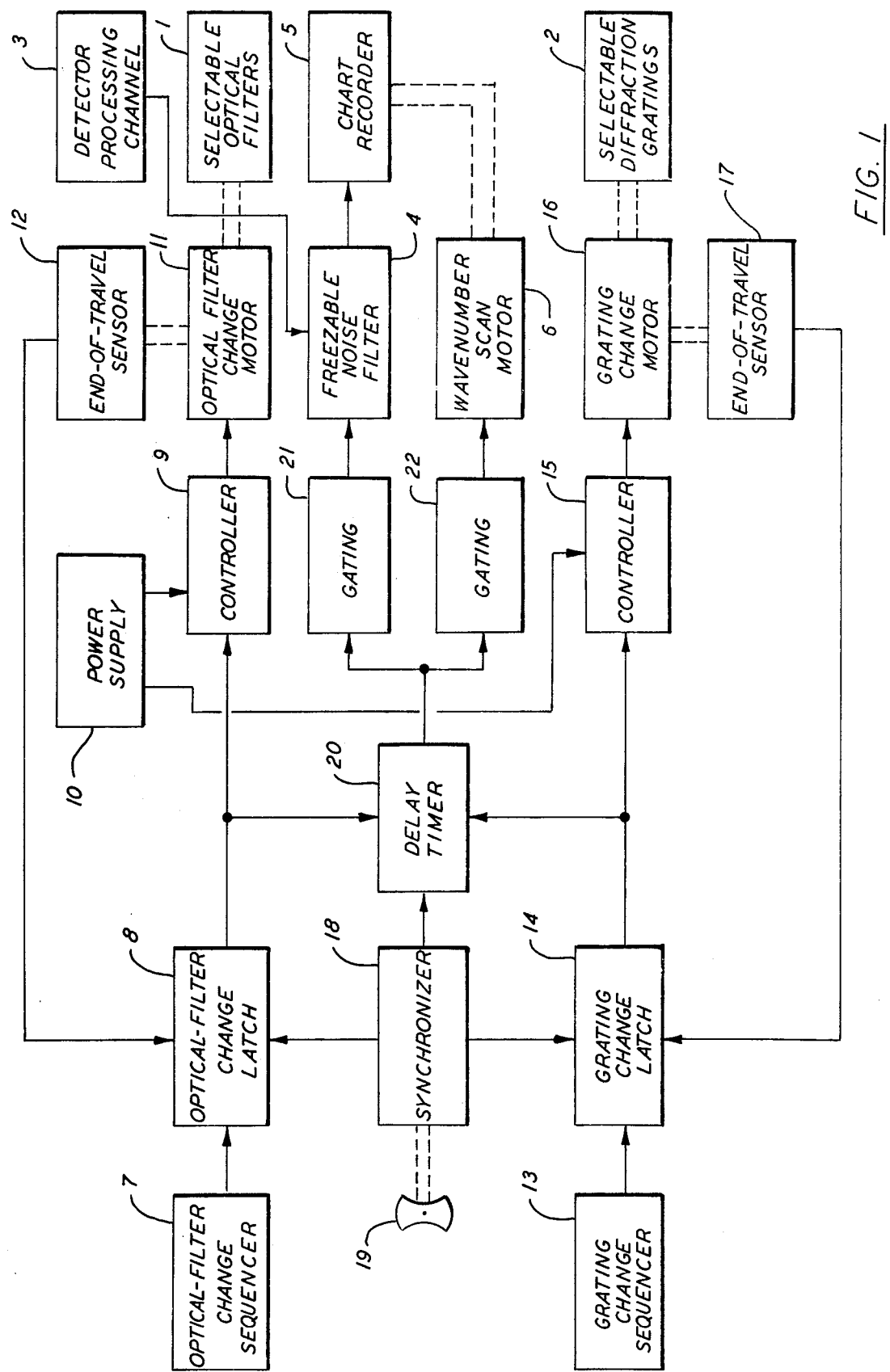

United States Patent [19]

Ford et al.

[11] 4,113,385
[45] Sep. 12, 1978

[54] TRANSIENT SUPPRESSOR NETWORK FOR SPECTROPHOTOMETERS AND THE LIKE

[76] Inventors: Michael Alan Ford, 7 Islet Park House, Islet Park, Maidenhead, Buckinghamshire; Henry Manifold Mould, 82 Hazelmere Rd., Penn, Buckinghamshire; Dieter Kolb, Boyne House, Grove Rd., Beaconsfield, Buckinghamshire, all of Great Britain

[21] Appl. No.: 757,204

[22] Filed: Jan. 6, 1977

[30] Foreign Application Priority Data

Jan. 7, 1976 [GB] United Kingdom ............... 00425/76

[51] Int. Cl.² .................... G01J 3/42; G01D 9/00; H03H 7/10
[52] U.S. Cl. .................... 356/96; 333/70 CR; 346/33 A
[58] Field of Search .............. 307/233 R; 328/167; 333/70 A, 70 CR, 70 R; 356/96, 97; 346/33 A

[56] References Cited

U.S. PATENT DOCUMENTS

| | | | |
|---|---|---|---|
| 3,537,797 | 11/1970 | Matthews | 356/97 |
| 3,843,259 | 10/1974 | Tohyama et al. | 356/97 |
| 3,930,727 | 1/1976 | Vergato | 356/96 |
| 3,995,207 | 11/1976 | Way | 346/33 A |

Primary Examiner—Alfred E. Smith
Assistant Examiner—Harry Barlow
Attorney, Agent, or Firm—Salvatore A. Giarratana; Francis L. Masselle; John D. Crane

[57] ABSTRACT

There is described an improvement for an apparatus employing a plurality of operational elements adapted to cooperate for producing an electrical signal representing the variation of an ordinate quantity with respect to an abscissa quantity changing at a controlled rate. At least one of said elements requires an adjustment during operation such as is capable of causing spurious transients in the electrical signal. The apparatus further comprises a filter for filtering the electrical signal before feeding the signal to a suitable utilization device such as a recorder. The improvement includes control means which operate to interrupt the ordinate quantity signal and cut off the filter response prior to any element adjustment. There is disclosed means for storing the output of the filter at cut off and for memorizing the point along the impulse characteristic of the filter at which cut off takes place. There is further disclosed means for sensing the completion of the element adjustment and for applying a predetermined time delay before the reinstatement of system operation. This eliminates the effect of transients at this point.

20 Claims, 5 Drawing Figures

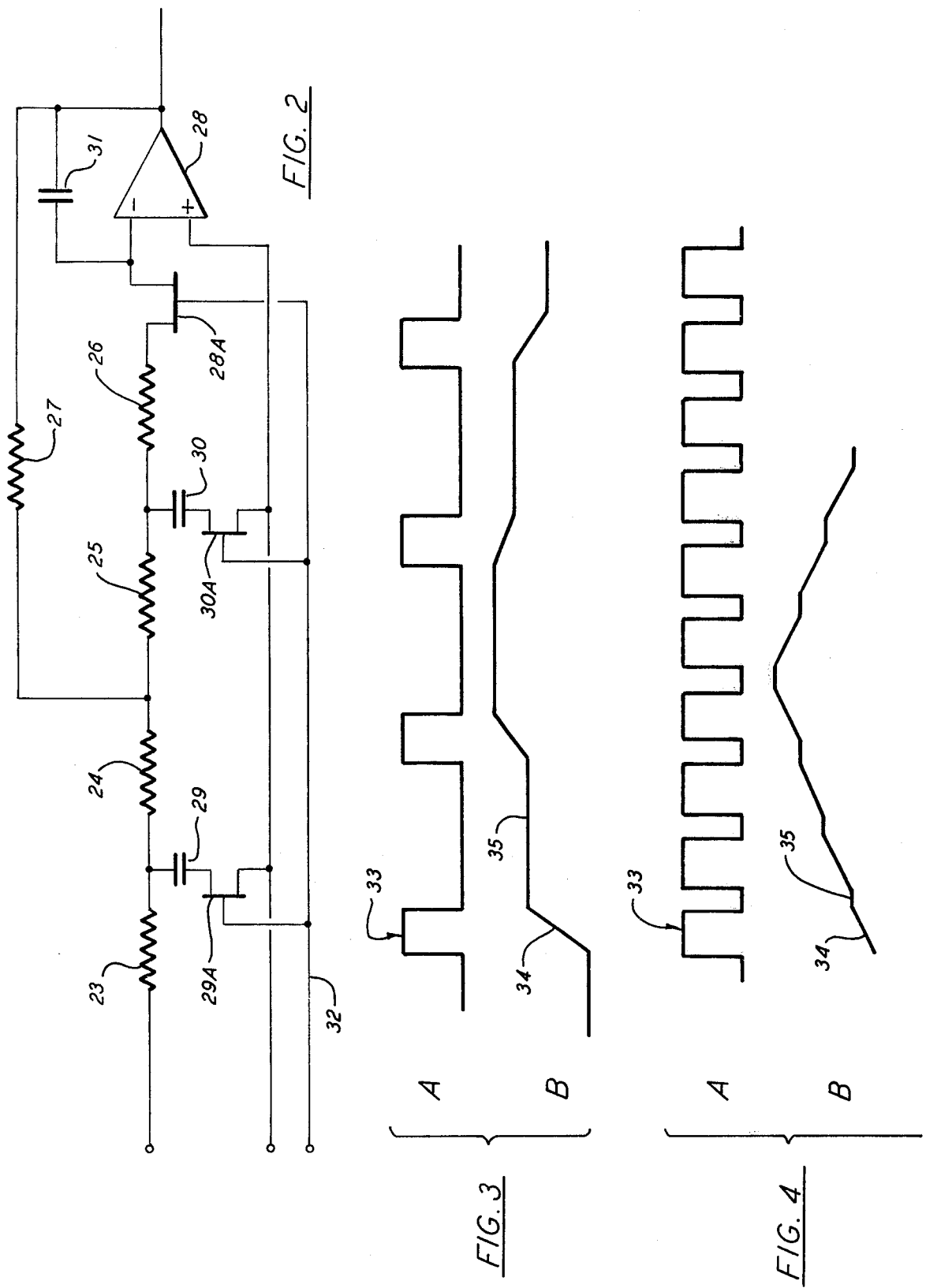

TRANSIENT SUPPRESSOR NETWORK FOR SPECTROPHOTOMETERS AND THE LIKE

The present invention relates to apparatus comprising a plurality of operational elements adapted to co-operate for producing an electrical signal representing the variations of an ordinate quantity with respect to an abscissa quantity changing at a controlled rate, said signal being routed through an electrical filter to a utilization device, e.g. a signal recorder, one at least of said elements requiring to be so adjusted in the course of evaluating said variations as to cause spurious transients to appear in the ordinate signal.

Spectrophotometers fall within the above-defined category and it will be assumed here that the reader is familiar with their general construction and operation so that specific mention need only be made of those elements and functions which have a direct bearing on a proper understanding of the invention in the context of a typical application thereof. At all events, prior art instrumentation is amply described in Infrared Spectroscopy, Experimental Methods and Techniques, by James E. Stewart, published by Marcel Dekker Inc., New York.

In a spectrophotometer, the ordinate quantity is sample percentage transmission (or absorption) and the abscissa quantity may be identified with wavenumber or wavelength scan for either ordinate presentation, or indeed with lapsed time in the type of operation usually called "time drive". The ordinate signal is produced by a detector responsive to photometric radiation that impinges thereon after passing through a chain of controlling elements, including the sample under analysis. The detector output signal undergoes changes, e.g. amplification, in a signal processing channel and finally is routed through a low-pass filter before being extended to a utilization device, which may be a chart recorder, a digital display, or any other convenient read out device.

In most spectrophotometers, rotatively mounted beam modifying means are employed, often referred to as "choppers", which cause the photometric radiation to reach the detector as a series of pulses of equal duration. Depending on instrument design, one chopper or a plurality of choppers are incorporated. The number of choppers included is not significant in the context of the present invention when applied to a spectrophotometer, and where reference is made to chopper in the singular, this shall not be taken to mean that the plural is excluded.

Between the beam modifying means and the detector a monochromator is found, wherein the wavelength of the radiation along the path to the detector is scanned with the aid of operational elements representing optical controlling elements, such as diffraction gratings. A grating is more frequently operated in such manner that the abscissa is made to read in wavenumbers. The motion for driving the grating is usually derived from a "wavenumber cam" keyed to a "wavenumber shaft" driven by a "wavenumber scan motor", which in modern instruments may be a stepper motor. Optical filters also play a part as controlling elements.

It is of course an advantage in any spectrophotometer to cover as wide a wavenumber scan range as possible. Unfortunately, some of the controlling elements cannot be made effective over the entire range. Gratings suffer from this limitation and this means that several different gratings may have to be brought in during a complete scan. Different optical filters must also be selected according to the wavenumber region that is being scanned. Because of this the detector output must inevitably include spurious changes whenever certain controlling elements are adjusted. We shall refer to these changes as spurious transients.

In a double-beam spectrophotometer, the detector signal comprises a component due to the sample beam and a component due to the reference beam. The electronic processing channel for this signal may be arranged to yield an output representing the ratio of the two components. Such a processing channel is said to be of the ratiometer type and the instrument incorporating it is referred to as a ratio-recording spectrophotometer. This type of spectrophotometer offers many well known advantages compared with other types but suffer to no lesser extent in the presence of spurious transients.

Clearly spurious transients can only impair photometric accuracy. Prior art attempts to cope with them have not been entirely successful, in that either they have not completely prevented the spurious transients from reaching the filter output or they have tended to create their own problems. Although we have led up to spurious transients in the context of a spectrophotometer, it will be readily appreciated that a similar situation may arise in a large range of apparatus falling within the language of the opening statement hereto.

The skilled in the art is aware, of course, that merely switching off a filter during the adjustment of an operational element, while storing the output level attained by the filter just prior to switch off, may eliminate spurious transients but at the cost of introducing intolerable photometric inaccuracies upon switching the filter on again, in that a large discontinuity is quite likely to arise in the impulse characteristic of the filter as between switch off and switch on.

The object of the present invention is to provide an improved apparatus of the type as generally outlined in the opening statement referred to above.

According to the present invention there is provided apparatus comprising a plurality of operational elements adapted to co-operate for producing an electrical signal representing the variations of an ordinate quantity with respect to an abscissa quantity changing at a controlled rate, a filter for filtering said electrical signal, and a utilization device responsive to the output of said filter, at least one of said elements requiring an adjustment in the course of evaluating said variations that is capable of causing spurious transients to appear in said signal, wherein means are provided for enabling in operation the ordinate quantity signal related to abscissa change to be interrupted and the filter to be cut off prior to said adjustment being made, the point along the impulse characteristic of the filter at which cut off takes place to be memorized and the ordinate signal value attained at said interruption to be stored.

If the filter is cut off coincidently with the interruption of the said ordinate quantity signal relates to abscissa change (hereinafter more succinctly referred to as the ordinate signal) before an element adjustment takes place, it follows that it may likewise be reinstated coincidently with the resumption of the ordinate signal. The reinstatement may be slightly delayed after the completion of the adjustment, so that spurious transients arising from the adjustment are not "seen" by the filter and, consequently, do not appear at the input of the utilization device.

In applying the expressed concept of the present invention, we may arrange for the element adjustment to be governed by control means which cut off the filter, interrupt the generation of the ordinate signal and start the adjustment, optionally and advantageously upon the occurrence of a pulse providing a convenient synchronization with said generation.

The control means may be arranged to sense the completion of the element adjustment and to apply a predetermined time delay immediately thereafter to allow spurious transients to die away before cancelling the filter cut off and restarting the generation of the ordinate signal. Where synchronization pulses are used, the time delay may be introduced by simply allowing a sufficient number of said pulses to occur for the element adjustment plus the constant delay represent the operational time interval of the control means.

The advantage of establishing the said operational time interval in the aforesaid manner is that no more time is consumed than is necessary to suit a given element adjustment. A possible alternative within the scope of the present invention, but one which is less advantageous in certain circumstances, is to predetermine the whole of the operational time interval to suit the element needing the lengthiest adjustment. This alternative is wasteful of time, particularly where great disparity exists in the adjustment duration of several elements requiring adjustment. The control means may include timing means for ensuring that the necessary controls for initiating and terminating the element adjustment as well as the filter cut off and the interruption of the ordinate signal are applied in the proper sequence. Where digital processing of the ordinate signal is included in the apparatus design, the use of said synchronization pulses, acting as clock pulses in steering at least in part the control means, is an advantage.

If physical displacement of an element is required in order to effect its adjustment, an element actuator may be included which is set in motion either simultaneously with, or shortly after, the interruption of said generation. The timing means may include an end-of-travel sensor operationally related to said element actuator to detect the completion of the element adjustment and initiate the said predetermined time delay.

In so far as the ordinate signal related to the abscissa change can only arise when the abscissa is changing at said controlled rate, the control means may be made to interrupt the generation of the ordinate signal by simply interrupting the generation of the abscissa.

Storage means associated with said filter and operatively related to said control means during said operational time interval may be employed for holding the output level reached by the filter at cut off and for storing a plurality of electrical signal values which together represent the point on the impulse characteristic of the filter attained by the filter output at cut off.

It is to be understood that in the present context a filter is said to be cut off if its input signals are no longer being convoluted through to the filter output.

In accordance with a preferred embodiment of the present invention, the memorizing of the point along the impulse characteristic of the filter at which the filter is cut off is performed by the filter itself by virtue of its construction, which enables the individual electrical signal values representing the said point to be stored during cut off and the output level reached by the filter at cut off to be concomitantly held. A filter capable of performing these functions is disclosed in copending U.S. application Ser. No. 754,643 of Michael Alan Ford entitled "Tunable Electrical Filter Network", executed on Dec. 14, 1976 and claiming priority under 35 USC 119 from U.K. Provisional Specification No. 00427/76, filed Jan. 7, 1976. In so far as said filter is able to retain not just the output level of the filter at cut off but also the information identifying the point on the impulse characteristic at which cut off took place, it is apt to refer to it as a "freezable" filter. The term and its derivatives will be used in the present context wherever it is convenient to do so.

The memorizing of the impulse characteristic information may be achieved by means of a plurality of simultaneously switchable capacitors in a multi-order filter including active elements, such as operational amplifiers, each capacitor storing one of said individual electrical signal values after the capacitors are simultaneously switched into an isolated state as the filter is cut off.

Semiconductor switches of the FET (field effect transistor) type may preferably be used for switching the capacitors, the switching being commanded through the control means. Similarly a switchable holding integrator may form part of the filter output stage, or may follow said stage, to retain the output level attained by the filter at cut off, the capacitors and the integrator being switched together.

The facility for varying the time constant of a "freezable" filter as described in the copending application referred to may optionally be included in an apparatus constructed in accordance with the present invention.

An apparatus in accordance with the present invention may form part of a ratio-recording spectrophotometer incorporating a "freezable" low-pass noise filter optionally arranged for variable time constant operation. The monochromator of said spectrophotometer may include diffraction gratings and optical filters as operational elements requiring adjustment capable of leading to the generation of spurious transients. Grating change actuator means and optical-filter change actuator means may be provided which co-operate with respective end-of-travel sensors. A sequencer referenced in operation to the angle of rotation of the wavenumber shaft may be incorporated as part of control means operatively connected to the actuators. The control means may include gating means for freezing the filter and simultaneously interrupting the wavenumber scan. The timing means may include a delay timer operatively connected to the sensors and the gating means. A chart recorder connected to the filter output may represent the utilization device.

Whichever its application, the present invention enables the filter to be cut off at will for a desired time interval during which an element adjustment may be made and any resulting spurious transients may be allowed to die away before the filter is reinstated at the output level and the point on the impulse characteristic at which the cut off took place so that the utilization device connected to the filter output will respond as if no cut off of the filter had in fact occurred. In the specific terms of a spectrophotometer associated with a chart recorder, this means that the trace drawn on the chart by the recording pen driven by the pen servo will show no break or anomaly due either to the generation of spurious transients or the process of cutting off the filter. The fidelity of the trace to the ordinate signal will be preserved as if no spurious transients or filter cut off had in fact occurred.

Figure 5:
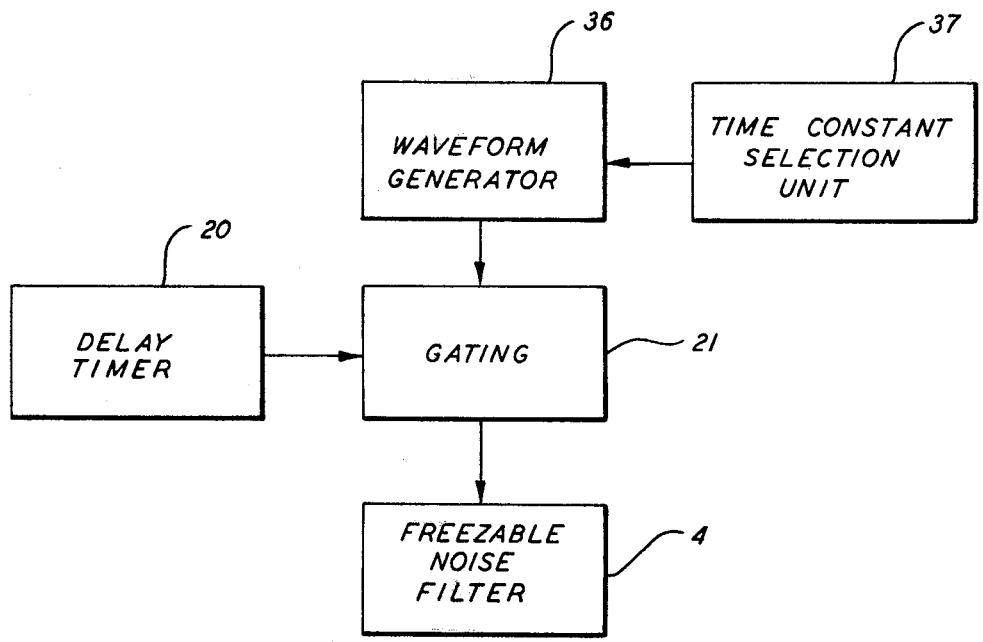

An apparatus in accordance with the present invention will now be described in greater detail with reference to the accompanying diagramatic drawings, wherein:

FIG. 1 is a block diagram of the said apparatus, forming part of a ratio-recording spectrophotometer;

FIGS. 2, 3 and 4 are reproduced from our copending application referred to and represent, respectively, the electrical diagram of a freezable filter, the switching waveform and output characteristics of the filter for a medium-value time constant, and the switching waveform and output characteristic of the filter for a low-value time constant; and FIG. 5 is a block diagram showing a modification of the FIG. 1 diagram.

In FIG. 1, the aforesaid operational elements include a plurality of selectable optical filters 1 and a plurality of selectable diffraction gratings 2 forming part of the spectrophotometer monochromator. A ratiometer-type processing channel 3 for handling the detector signal feeds into a freezable electrical noise filter 4 connected to a utilization device in the form of a chart recorder 5 having a chart transport mechanism (not shown) driven by the wavenumber scan motor 6. A wavenumber shaft (not shown) keyed to a wavenumber cam (not shown) is also driven by the scan motor 6. The wavenumber cam provides the motion, through a cam follower device (not shown), for driving in a wavenumber scan mode whichever of diffraction gratings 2 is selected by means to which reference will presently be made.

Broadly, the diagram of FIG. 1 represents control means for temporarily interrupting the ordinate signal by de-energizing the wavenumber scan motor 6, and for cutting off the freezable electrical filter 4 for an operational time interval that includes the changing of one of optical filters 1 or gratings 2. Timing means forming part of the control means automatically enable the two operations upon the occurrence of predetermined wavenumber values in the course of a wavenumber scan of the spectrophotometer and at the same time enable either of two electrical channels, indentifiable as an optical-filter change channel and a grating change channel. After either an optical-filter change or a grating change has been completed, the said timing means introduce a predetermined time delay, sufficient to allow spurious transients to die away before the control means re-energizes the wavenumber scan motor 6 and unfreezes the filter 4. The cycle is repeated when the timing means respond to a further predetermined wavenumber value at which an operational element change is required. Storage means for holding the output of the filter 4 during cut off and for memorizing the aforesaid electrical signal values form part of the construction of filter 4, as will be presently described.

The optical-filter change channel comprises an optical-filter change sequencer 7 coupled to the wavenumber shaft, an optical-filter change latch 8 connected to the output of the sequencer 7, a controller 9 for switching the power supply 10 to an optical-filter change motor 11 in response to the output of the latch 8, and an end-of-travel sensor 12 coupled to the motor 11 connected for selecting one of the optical filters 1. Similarly, the grating change channel comprises a grating change sequencer 13, a grating change latch 14, a controller 15 for switching the power supply 10 to a grating change motor 16 in response to the output of the latch 14, and an end-of-travel sensor 17 coupled to the motor 16 connected for selecting one of the gratings 2. The sequencer 7 and 13, the latches 8 and 14, the controllers 9 and 15 and the sensors 12 and 17 form part of the control means so far described, with sequencers 7 and 13 and sensors 12 and 17 representing a part of the timing means within the control means.

The two channels share a synchronizer 18 referenced to the spectrophotometer chopper 19 and arranged to produce a synchronizing output pulse at the beginning of each chopper cycle. They also share a delay timer 20. The units downstream of the delay timer 20 have already been introduced, with the exception of the gating 21 for controlling the freezing and unfreezing of the electrical filter 4 and the gating 22 for controlling the energization and de-energization of the scan motor 6. The synchronizer 18, the chopper 19, the delay timer 20, the gating 21 and the gating 22 complete the control means shown in FIG. 1, the synchronizer 18, the chopper 19 and the delay timer 20 completing the timing means part of it.

The sequencer 7 and the sequencer 13 are both phased to the wavenumber shaft so that change command pulses are produced by one or the other sequencer when the wavenumber shaft has reached angular positions corresponding to predetermined wavenumber values at which changes are required in accordance with the monochromator design.

The operation of the optical-filter change channel will be considered first. Upon the occurrence of one of a plurality of predetermined wavenumber values, the sequencer 7 yields at its output a command pulse. The latch 8 has one of its three inputs connected to the output of the sequencer 7 but its construction is such that it will not latch on and produce an output until another of its inputs receives a synchronizing pulse from the synchronizer 18. When this condition has been satisfied, an output is established and maintained until the remaining input of latch 8 receives an unlatching pulse in a manner that will be presently explained. The controller 9 has a first input connected to the output of the latch 8 and a second input connected to the electrical power supply 10. When the latch 8 produces an output pulse, the controller 9 responds to it by extending the power supply to the terminals of the motor 11, which begins to rotate and to index round a rotary device comprising a plurality of optical filters radially disposed around a shaft. This unit, mounting the selectable optical filters 1, is of conventional design and need not be shown in detail. After the motor 11 has rotated sufficiently for the newly selected optical filter to have reached its proper operative position in the path of the photometric beam, the sensor 12 delivers an unlatching pulse to the latch 8 and the motor 11 comes to rest.

The provision for freezing the electrical filter 4 and inhibiting the scan motor 6 for the duration of the optical-filter change plus a predetermined time delay will now be described. The output pulse produced by the latch 8 as well as being made available at the input of the controller 9 is also extended to a first input of delay timer 20, whereat it acts as a disabling control signal. A second input of the delay timer 20, which includes a digital counter, receives the output pulses of the synchronizer 18. The timer 20 is so constructed and controlled that it will not yield an output to the gatings 21 and 22 while a disabling control signal is present at said first input but will start counting the synchronizer pulses the moment the latch 8 is unlatched upon completion of an optical-filter change and the disabling control signal is thus removed. As the last of a predetermined number of pulses is counted, the delay timer 20 produces an output which activates gatings 21 and 22.

The gating 21 is so constructed that in the absence of an input thereto the electrical filter 4 is kept in the frozen condition. It follows, therefore, that during the execution of the optical-filter change and for a predetermined time delay after the completion of the change the filter 4 is frozen. Similarly the gating 22 remains disabled during the same period and the scan motor 6 de-energized. When gatings 21 and 22 are activated the filter 4 is unfrozen and the scan motor 6 restarted.

The operation of the grating change channel is essentially similar. Briefly, the sequencer 13 delivers a change command pulse to the latch 14, which upon receipt of a pulse from the synchronizer 18 latches on to produce an output that through the controller 15 extends the supply 10 to the motor 16, until the sensor 17 sends out an unlatching pulse to the latch 14 upon completion of the grating change. The delay timer 20 receives a disabling control signal from the latch 14 during the execution of the grating change and after a predetermined delay from the completion of the change produces an output which operates the gatings 21 and 22, with the results already described with reference to the filter change channel.

In the spectrophotometer associated with the present embodiment, as indeed in any conventional ratio-recording spectrophotometer, one complete chopper cycle supplies the information required to generate one data point of the ordinate, i.e. an elemental ordinate signal level representing the ratio between the sample channel contribution to the detector signal and the reference channel contribution over the said complete cycle. Successive data points reaching the electrical filter input become convoluted by the filter characteristic in passing through to the filter output, after a lag determined by the filter time constant.

Freezing the filter so that both the filter output existing at filter cut off and the electrical signal values represent the point on the impulse characteristic attained by the filter output at cut off are stored, while the wavenumber scan motor is de-energized means that upon simultaneously unfreezing the filter and restarting the wavenumber scan, the pen servo of the chart recorder will track the filter characteristic from the frozen point as new data points are generated and convoluted through to the output of the filter. In other words, the pen servo will track the filter output through an operational element change as if the wavenumber scan, and consequently the ordinate signal generation, had not been interrupted at all. Furthermore, because the duration of the interruption is not critical and is only limited by the ability of the noise filter to remain frozen without significant leakage, sufficient time may be allowed after an operational element change to allow spurious transients to die away before the ordinate signal generation is resumed. The spurious transients are therefore prevented from marring the recorded ordinate signal following the element change operation.

The derivation of synchronizing pulses from chopper 19 is purely a matter of practical convenience. The synchronizer 18 could in fact be driven by some other synchronization source, not necessarily providing a signal corresponding to the beginning of a chopper cycle but at some other convenient stage in the operation of the spectrophotometer. In fact, although the use of synchronizing pulses acting as clock pulses is useful in a spectrophotometer including a great deal of digital processing of the detector signal, it is not in fact essential. If it were dispensed with, the sequencers 8 and 14 in conjunction with the end-of-travel sensors 12 and 17 would adequately perform the timing task in many applications.

The electrical filter 4 conforms to the filter disclosed in our copending application, imported in full into the present application. FIGS. 1 to 3 of the single drawing accompanying the said copending application are reproduced for convenience in the present application as FIGS. 2 to 4 together with the description appertaining thereto, except that the numerical references have been altered to avoid duplication of references already used in FIG. 1 of the present application.

FIG. 2 shows a freezable electrical filter arranged for variable time constant operation, which is achieved by freezing and unfreezing the filter periodically at a controlled mark-space ratio, as described in the copending operation. The said filter is a basic, Shumard-type, third-order filter as may be used for filtering the noise from the output of a scanning spectrophotometer. It has an RC network that includes 4 series-connected resistors: resistor 23 having a suitable value V; resistors 24 and 25, each of value 2V; and resistor 26 equal in value to resistor 23. A further resistor 27 is in the feedback loop of the operational amplifier 28 that feeds into the junction between resistors 24 and 25.

The capacitative means of the RC network include equal-value capacitors 29 and 30, the former having one terminal connected to the junction between resistors 23 and 24 and the latter a terminal connected to the junction between resistors 25 and 26. A feedback capacitor 31 is strapped between the input and output of amplifier 28.

Capacitor 29 has the other terminal connected to ground through FET (Field Effect Transistor) 29A and capacitor 30A is similarly connected to ground through FET 30A. In addition, and FET 28A is provided between the resistor 26 and the input of amplifier 28. The gates of all FET's are commoned to switching line 32 through which the switching waveform from a pulse generator (not shown) controlled by a time-constant selection unit (not shown) is available for switching the FET's at a mark-space ratio representing the selected effective filter time constant.

FIG. 3 illustrates the switching waveform and the filter output when p.r.f. (pulse repetition frequency) modulation is used and a medium-value time constant has been selected. Curve A of FIG. 3 represents the switching waveform, including constant width switching pulse 33 followed by a comparatively long OFF-time. Curve B of FIG. 3 illustrates part of the filter output for a single impulse input, including elemental portions of the design response such as 34, coincident with the ON-time of the FET's, each followed by a portion such as 35 representing the terminal value of the preceding elemental portion sustained unchanged for the whole of the OFF-time.

FIG. 4 represents the two curves A and B of FIG. 3 when a comparatively short time constant has been selected. Because the p.r.f. has been increased, the OFF-time of the FET's has decreased and consequently the portions held at constant value in curve B of FIG. 3 have now contracted. If the p.r.f. is increased still further, a point will be reached where the response characteristic will include no appreciable constant-value portions and the shortest time constant will be operative.

It will be appreciated that capacitors 29 and 30 in FIG. 2 represent the storage means enabling the point reached by the impulse characteristic of the filter at cut off to be memorized and the integrator 28 the storage means for holding the output level reached by the filter at cut off, both storage means holding throughout the OFF-time of the switching waveforms. At the start of each ON-time the filter resumes its operation from that very point, with the result that the inhibition of the filter during the OFF-time has no effect on the impulse characteristic of the filter output.

Now, the switching waveform may be arranged to provide a sustained level at the FET gates for normally keeping all FET's in a conductive state and an absence of said level when the filter needs to be frozen. This would enable the filter depicted in FIG. 2 to be used in the performance of the present invention, the gating 21 in FIG. 1 providing the required waveform when its output is connected to line 32. A possible alternative is depicted in FIG. 5 wherein the gating 21 controlled by the delay timer 20 is interposed between a waveform generator 36 and the freezable filter 4, the generator 36 providing an output waveform the mark-space ratio of which varies in response to a time-constant selection unit 37. This enables the filter freeze facility during an element adjustment to be combined with the variable time constant facility as initially disclosed in our co-pending application.

What is claimed is:

1. In an apparatus having a plurality of operational elements adapted to cooperate for producing an electrical signal representing variations of an ordinate quantity with respect to an abscissa quantity changing at a controlled rate, at least one of said elements being subject to an adjustment during the evaluation of said variations that is capable of causing spurious transients to appear in said signal, an electrical filter for filtering said signal, and a utilization device responsive to the output of said filter, means for substantially excluding said spurious transients from the filter output comprising:
    (a) control means for interrupting the generation of the ordinate quantity signal related to abscissa change and for cutting off the filter for an operational time interval including the duration of said adjustment and additional time sufficient to allow said spurious transients to die away;
    (b) storage means associated with said filter and operatively related to said control means during said operational time interval for holding the output level reached by the filter at cut off and for storing a plurality of electrical signal values which together represent the point on the impulse characteristic of the filter attained by the filter output at cut off, whereby upon the control means re-establishing the said ordinate quantity signal and removing the filter cut off at the end of said operational interval, and therefore after the spurious transients have died away, the filter output is restored both to said level and to said point as if no cut off had taken place, with the result that spurious transients are excluded from the filter output without the fidelity of the filter output being affected.

2. Apparatus as claimed in claim 1, wherein the control means include timing means for determining the start and the duration of the operational time interval.

3. Apparatus as claimed in claim 2, wherein the timing means are adapted to set up an operational time interval longer than the duration of said adjustment to enable spurious transients to die away between the completion of said adjustment and the end of said operational time interval.

4. Apparatus as claimed in claim 3, wherein said timing means include a delay timer controlled to introduce a predetermined time delay between the end of said adjustment and the end of the operational time interval.

5. Apparatus as claimed in claim 3, wherein the control means is adapted to interrupt the generation of the abscissa in order to interrupt the generation of the ordinate quantity signal.

6. Apparatus as claimed in claim 3, wherein said filter is a freezable filter and at least first storage means for storing said electrical signal values form part of said freezable filter.

7. Apparatus as claimed in claim 4, wherein said timing means include a sensor for generating a limit signal upon completion of said adjustment, said delay timer being adapted to initiate said time delay in response to said limit signal.

8. Apparatus as claimed in claim 7, including actuator means for effecting said adjustment and wherein said sensor is associated with said actuator means to produce a signal representing the end of travel of the actuator means.

9. Apparatus as claimed in claim 8, wherein the timing means comprise synchronizing means coupled to a suitable operational element of the apparatus for time referencing the operation of the control means to the generation of the ordinate quantity signal.

10. Apparatus as claimed in claim 9, wherein the synchronizing means includes a pulse generator and the delay timer is adapted to count a predetermined number of said pulses from the end of said adjustment.

11. Apparatus as claimed in claim 6, wherein said first storage means comprise a plurality of capacitors forming part of the filter circuit, each of said capacitors cooperating with a low-leakage electronic switch and all the electronic switches being adapted to isolate the capacitors from the remainder of the freezable filter circuit in response to a gating signal from the control means during filter cut off.

12. Apparatus as claimed in claim 11, wherein each electronic switch is connected between one terminal of the associated capacitor and ground.

13. Apparatus as claimed in claim 11, wherein second storage means for holding the output level reached by the filter at cut off also form part of the freezable filter and a further low-leakage electronic switch adapted to be operated simultaneously with the aforesaid electronic switches is provided to isolate the second storage means from the remainder of the freezable filter circuit simultaneously with the said capacitors.

14. Apparatus as claimed in claim 11, wherein said apparatus forms part of a spectrophotometer and includes a plurality of selectable diffraction gratings and a grating change actuator operationally related to the control means for effecting a grating change during the operational time interval.

15. Apparatus as claimed in claim 14, wherein said apparatus further includes a plurality of selectable filters and a filter change actuator operationally related to the control means for effecting a filter change during the operational time interval.

16. Apparatus as claimed in claim 14, wherein said control means is adapted to deenergize the abscissa scan motor of the spectrophotometer in order to interrupt the generation of the ordinate quantity signal.

17. Apparatus as claimed in claim 15, wherein the timing means includes sensors for producing limit signals representing the end of travel of the grating change actuator and the filter change actuator respectively.

18. Apparatus as claimed in claim 17, wherein the timing means further includes a delay timer responsive to either limit signal to extend the operational time interval beyond the duration of the element adjustment to enable spurious transients to die away before the filter cut off is removed.

19. Apparatus as claimed in claim 17, wherein said timing means include synchronizing means coupled to a suitable operational element of the spectrophotometer for time referencing the operation of the control means to the generation of the ordinate quantity signal of the spectrophotometer.

20. Apparatus as claimed in claim 19, wherein the synchronizing means is a pulse generator referenced to the rotation of the beam chopping means of the spectrophotometer.

* * * * *